United States Patent [19]

Nagai et al.

[11] Patent Number: 5,503,897
[45] Date of Patent: Apr. 2, 1996

[54] SHAPED ARTICLES AND METHOD OF MAKING SAME

[75] Inventors: Shoichi Nagai; Masatoshi Takesue; Masamoto Uenishi; Mitsuharu Morita; Yoshie Nagao; Yuji Akaki, all of Nagoya, Japan

[73] Assignee: Mitsubishi Rayon Co., Ltd., Tokyo, Japan

[21] Appl. No.: 260,750

[22] Filed: Jun. 15, 1994

Related U.S. Application Data

[62] Division of Ser. No. 610,797, Nov. 8, 1990, abandoned.

[30] Foreign Application Priority Data

| Nov. 17, 1989 | [JP] | Japan | 1-297554 |
| Nov. 17, 1989 | [JP] | Japan | 1-297555 |
| Dec. 22, 1989 | [JP] | Japan | 1-331298 |
| May 25, 1990 | [JP] | Japan | 2-133856 |
| Jul. 26, 1990 | [JP] | Japan | 2-198489 |

[51] Int. Cl.$^6$ .................................................. D06N 7/04
[52] U.S. Cl. ........................ 428/141; 427/341; 427/558; 428/409; 428/913
[58] Field of Search ................. 385/116; 427/316, 427/322, 341, 558; 428/141, 156, 161, 409, 913; 522/121, 122, 129, 154

[56] References Cited

U.S. PATENT DOCUMENTS

| 2,999,056 | 9/1961 | Tanner | 522/122 |
| 3,968,306 | 7/1976 | Yoshihara et al. | 428/336 |
| 4,528,245 | 7/1985 | Jobbins | 427/322 X |
| 4,852,982 | 8/1989 | Yamamoto | 385/116 |

FOREIGN PATENT DOCUMENTS

| 0075538 | 3/1983 | European Pat. Off. . |
| 0102830 | 3/1984 | European Pat. Off. . |
| 101121 | 6/1983 | Japan . |
| 49038 | 3/1985 | Japan . |
| 73961 | 4/1986 | Japan . |
| 2018621 | 10/1979 | United Kingdom . |

OTHER PUBLICATIONS

Database WPI, Derwent Publications, AN 85–174622, & Chemical Abstracts & Patent Abstracts of Japan, for JP-A-60 103 347, Jun. 7, 1985.
Database WPI, Derwent Publications, AN 92–327519, & Patent Abstracts of Japan for JP-A-04 234 442, Aug. 24, 1992.
World Patent Index Latest, AN 88–366275, & JP-A-63-278-052, Nov. 15, 1988.
World Patent Index Latest, AN 88–157370, & JP-A-63-096-601, Apr. 27, 1988.
World Patent Index Latest, AN 87–099069, & JP-A-62-048-596, Mar. 3, 1987.

Primary Examiner—Michael Lusignan
Attorney, Agent, or Firm—Oblon, Spivak, McClelland, Maier & Neustadt

[57] ABSTRACT

Disclosed are shaped articles excellent in dyeability, antistatic properties, antifogging properties and other properties which include a polymer derived from at least a multifunctional monomer having two or more (meth)acryloyloxy groups per molecule, a surface of the polymer having 0.02 to 0.20 μmol/cm$^2$ of acidic groups, a method of making such shaped articles, an antistatic material utilizing such a shaped article, and an antireflection material utilizing such a shaped article.

17 Claims, 8 Drawing Sheets

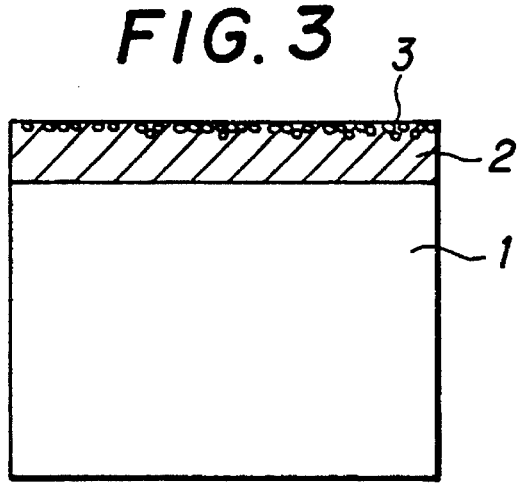
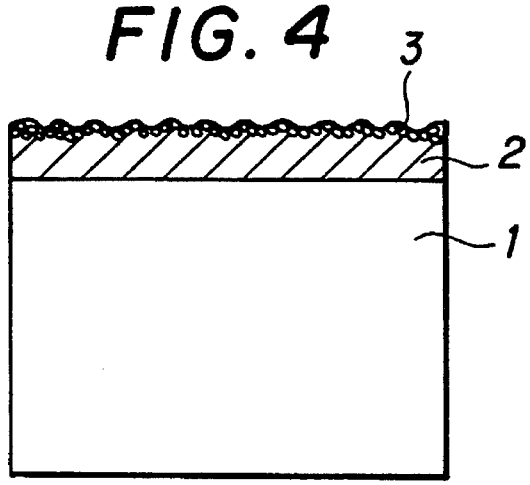
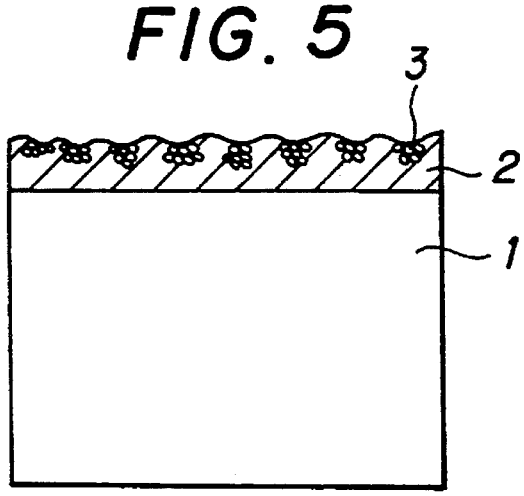

SHAPED ARTICLES AND METHOD OF MAKING SAME

This is a division of application Ser. No. 07/610,797, filed on Nov. 8, 1990, now abandoned.

BACKGROUND OF THE INVENTION a. Field of the Invention

This invention relates to shaped articles exhibiting high surface hardness, having a dyeable surface, and additionally having antistatic, antifogging and/or antireflection properties, as well as a method of making such shaped articles. The shaped articles of this invention can be used in various industrial fields including, for example, architectural interior finishing and electronic fields.

b. Description of the Prior Art

Generally, organic polymeric materials have many advantages such as light weight, high impact resistance and good processability, and are hence being used in wide applications.

However, ordinary organic polymeric materials are softer than inorganic materials such as metals and glass. Thus, they have the disadvantage that their surface is subject to damage.

Accordingly, it has heretofore been proposed to provide the surfaces of shaped articles of organic polymeric material with a cured coating of a multifunctional monomer.

Such a cured coating of a multifunctional monomer exhibits high surface hardness, but has several disadvantages. Specifically, (1) it is very difficult to dye the coating. (2) The coating tends to build up electrostatic charges and, therefore, the surface of the shaped article tends to attract dust and dirt. This poses problems when the shaped article is used as a windowpane of a clean room or as an antireflection material for use in front of CRTs and LCDs. Moreover, (3) The coating tends to become foggy when the surface temperature of the shaped article is lower than the dew point of the environment. The problem of poor dyeability is due to the fact that the dense network structure of the cured coating prevents the penetration of dye molecules, and the problem of fogging is due to the fact that the surface of the cured coating lacks hydrophilic groups such as acidic groups. Meanwhile, a number of methods for introducing acidic groups into linear high polymers are known in the prior art. They include, for example, chromic acid treatment of polyethylene [Souhenug Wu: "Polymer Interface and Adhesion" (1982)], oxygen plasma treatment of polyethylene [Nuzzo: Macromolecules, 17, 1013 (1984)], grafting of acrylic acid onto polyethylene terephthalate by means of a low-temperature plasma [Bradley: Vacuum Technology, March, 53 (1981)], photo-induced graft polymerization of (meth)acrylic acid onto a polyolefin compound coated with a sensitizer [Hagiwara: J. Plym. Sci. Poly. Lett. Fd., 19, 475 (1981)], irradiating a polymer having sulfonyl groups with ultraviolet light (Japanese Patent Publication No. 1601/1987), and alkali hydrolysis treatment of polyacrylonitrile type high polymers [Japanese Patent Publication Nos. 17151/'76 and 42916/'77]. In adition, the surface modification of polyethylene terephthalate by utilization of depolymerization with short-wave ultraviolet light [S. Lazare: J. Am. Chem. Soc., 106, No. 15, 4288 (1984)] is also known.

However, these treating methods have various disadvantages. Specifically, chromic acid treatment is effective only for polyethylene and the like. Plasma treatment generally requires expensive equipment and must be performed under reduced pressure. Photo-induced graft polymerization have many restriction on operating conditions, such as the necessity of effecting the reaction in a monomer or in a high concentration of monomer. Alkali hydrolysis treatment is effective only for readily alkali-hydrolyzable polymers.

Moreover, where acidic groups are introduced into linear high polymers according to the above-described methods, it is impossible to achieve a sufficient level of hardness.

SUMMARY OF THE INVENTION

Accordingly, it is an object of the present invention to provide shaped articles having sufficient hardness, high abrasion resistance and good dyeability and additionally having excellent antistatic, antifogging and/or antireflection properties.

It is another object of the present invention to provide a method of making such shaped articles which comprises a sequence of simple steps and uses inexpensive equipment.

The above objects of the present invention can be accomplished by the following shaped articles, antistatic material, antireflection material, and method of making shaped articles.

A shaped article including a polymer derived from at least a multifunctional monomer having two or more (meth)acryloyloxy groups per molecule, a surface of the polymer having 0.02 to 0.20 $\mu$mol/cm$^2$ of acidic groups.

A shaped article including a polymer derived from at least a multifunctional monomer having two or more (meth)acryloyloxy groups per molecule, a surface of the polymer presenting an undulated profile characterized by an arithmetical mean deviation ($R_a$) of 0.1 to 5.0 $\mu$m and an average wavelength ($\lambda_a$) of 5 to 50 $\mu$m, the whole undulated surface having 0.02 to 0.20 $\mu$mol/cm$^2$ of acidic groups.

A shaped article including a polymer derived from at least a multifunctional monomer having two or more (meth)acryloyloxy groups per molecule, a surface of the polymer presenting a minutely undulated profile, the depressed parts of the surface having a larger quantity of acidic groups than the raised parts thereof.

An antistatic material comprising a shaped article having at least one surface formed of a polymer derived from at least a multifunctional monomer having two or more (meth)acryloyloxy groups per molecule, a surface of the polymer having 0.02 to 0.20 $\mu$mol/cm$^2$ of acidic groups, the acidic group-bearing surface being covered with a metallic compound and/or organic cationic compound containing a metallic element belonging to group III, IV or V of the periodic table.

An antireflection material having antistatic properties which comprises a shaped article having at least one surface formed of a polymer derived from at least a multifunctional monomer having two or more (meth)acryloyloxy groups per molecule, a surface of the polymer presenting an undulated profile and having 0.02 to 0.20 $\mu$mol/cm$^2$ of acidic groups in the depressed parts or in both the depressed and the raised parts, the acidic group-bearing surface being covered with a metallic compound and/or organic cationic compound containing a metallic element belonging to group III, IV or V of the periodic table.

A method of making shaped articles which comprises the steps of (a) providing a body including a polymer derived from at least a multifunctional monomer having two or more (meth)acryloyloxy groups per molecule, (b) irradiating a surface of the polymer, wholly or partially, with ultraviolet light having a wavelength of 300 nm or less, and (c) subjecting the irradiated surface to an alkali treatment.

A method of making shaped articles which comprising the steps of (a) providing a body including a polymer derived from at least a multifunctional monomer having two or more (meth)acryloyloxy groups per molecule, a surface of the polymer presenting an undulated profile characterized by an arithmetical mean deviation ($R_a$) of of 0.1 to 5.0 μm and an average wavelength ($\lambda_a$) of 5 to 50 μm, (b) irradiating the whole undulated surface with ultraviolet light having a wavelength of 300 nm or less, and (c) subjecting the irradiated surface to an alkali treatment.

As used herein, the term "shaped article" means an article having a particular shape, and the term "(meth)acryloyl" means acryloyl and/or methacryloyl.

The shaped articles of the present invention have high surface hardness and excellent dyeability due to the presence of a large quantity of acidic groups in the surface. Moreover, the acidic groups provide good wettability by water, so that the shaped articles of the present invention can be used as spectacle lenses having antifogging properties, and the like. Furthermore, the shaped articles of the present invention can also be used as substrates for the formation of Langmuir-Blodgett films and as selective light-absorbing or relfecting materials having a film of a metallic compound which strongly adheres to acidic groups.

The undulations optionally formed in the surface of the shaped articles of the present invention impart a matte, high-grade appearance thereto. Especially where the antireflection material of the present invention is transparent, transmitted images can be clearly discerned, but reflected images formed by external light are blurred. Thus, it can be disposed in front of the displays of office automation equipment to lessen the eyestrain of the operator. The method of making shaped articles in accordance with the present invention comprises a sequence of simple steps and can be carried out by use of simple equipment.

BRIEF DESCRIPTION OF THE DRAWINGS

FIGS. 1, 2, 3, 4 and 5 are schematic fragmentary sectional views illustrating various embodiments of the shaped article of the present invention;

DESCRIPTION OF THE PREFERRED EMBODIMENTS

The shaped articles of the present invention will be specifically described hereinbelow.

Figure 1:
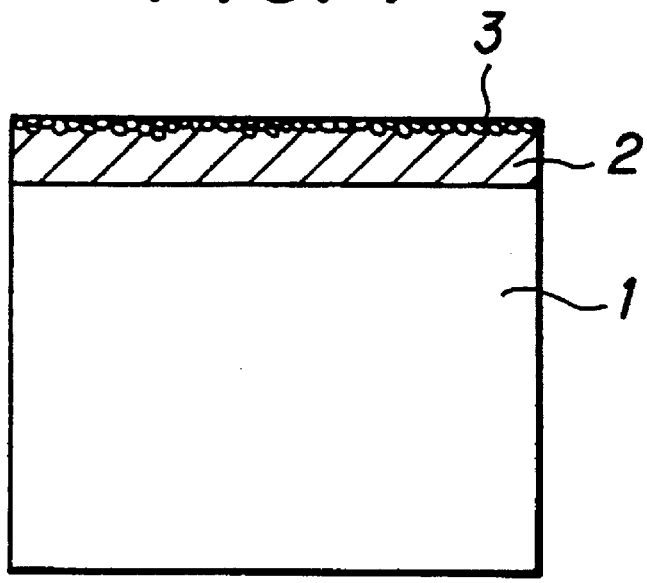

FIG. 1 is a schematic fragmentary sectional view illustrating a shaped article in accordance with one embodiment of the present invention. In this embodiment, at least a part of the surface of a substrate 1 is provided with a polymer layer 2 consisting of a polymer having a structure derived from a multifunctional monomer having two or more (meth)acryloyloxy groups per molecule. Moreover, an appropriate amount of acidic groups 3 are present only in the surface of the polymer layer 2.

The material constituting the substrate 1 preferably comprises one having sufficient transparency to make transmitted images clearly discernible. However, no particular limitation is placed on the type of the material and a variety of materials can be used. Preferably, the substrate 1 consists of an organic material. However, inorganic materials and composites formed of inorganic and organic materials can also be used for the substrate 1. Useful organic polymeric materials include various resins such as acrylic resins, polycarbonate resins, polyester resins, polystyrene resin and vinyl chloride resin.

In the shaped articles of the present invention, the substrate 1 is not always necessary. Depending on its intended purpose of use of the shaped article, the substrate 1 may consist of the same material as the polymer layer 2. In other words, the entire shaped article may consist of the material of the polymer layer 2.

Figure 2:
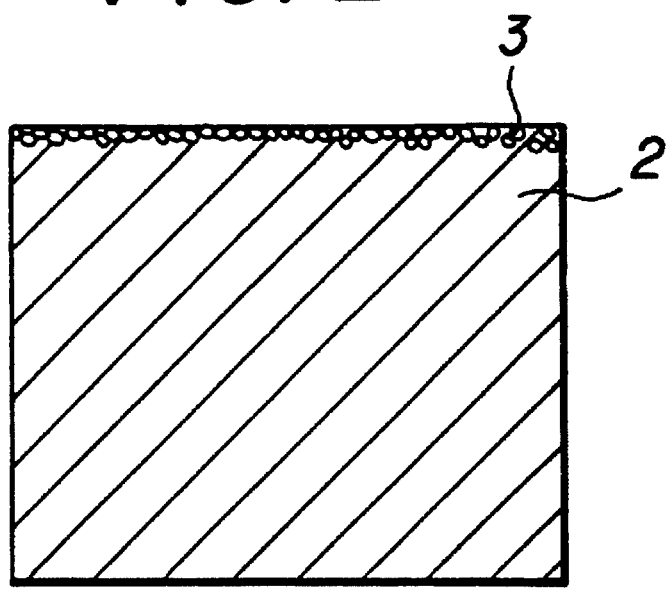

In the polymer layer 2 shown in FIGS. 1 and 2, a crosslinked structure is formed owing to the presence of (meth)acryloyloxy groups. This polymer structure causes the shaped articles of the present invention to have adequate surface hardness and good abrasion resistance. Specific examples of the multifunctional monomer will be given later.

According to the manner in which acidic groups are formed in the surface of the polymer layer 2, the shaped articles of the present invention can be divided into three types: type (i) in which the surface is planar and acidic groups 3 are formed over the whole surface, as illustrated in FIG. 3; case (ii) in which the surface has a minutely undulated profile and acidic groups 3 are formed over the whole surface, as illustrated in FIG. 4; and case (iii) in which the surface has a minutely undulated profile and acidic groups 3 are formed predominantly in the depressed parts. In each case, the acidic groups 3 are formed in a quantity of 0.02 to 0.2 μmol/cm$^2$.

Thus, in all of types (i) to (iii), a large quantity of acidic groups 3 are formed in the surface of the shaped articles of the present invention. Owing to the presence of a large quantity of acidic groups 3, the surface has a strong affinity for basic substances and can hence be readily colored with basic dyes. Moreover, the surface has good wettability by water.

The shape of the undulated surface of the polymer layer 2 may vary according to the intended purpose of use. Especially where the shaped article is transparent and used as an antireflection material in front of the screens of CRTs and LCDs, its undulated surface should preferably have a profile characterized by an arithmetical mean deviation ($R_a$) of 0:1 to 5.0 μm (ISO 4287/1) and an average wavelength ($\lambda_a$) of 5 to 50 μm (ISO 4287/1), so as to secure the clarity of transmitted images and reduce the brightness of reflected images formed by external light. More preferably, the profile of the undulated surface has an arithmetical mean deviation of 0.3 to 2.0 μm and an average wavelength of 10 to 30 μm.

The surface hardness of the shaped articles of the present invention is evaluated (1) in terms of pencil hardness (JIS K 5400) and (2) by means of a steel wool abrasion test. The steel wool abrasion test employed in the present invention comprises placing a pad of #0000 steel wool (with a sectional area of 4 cm$^2$) on a specimen under a predetermined load, moving the pad back and forth 100 times, and then evaluating the degree of marring in terms of transmittance, haze value or the like. The surface hardness of the shaped articles of the present invention should preferably be such that the surface has a pencil hardness of H or greater and the steel wool abrasion begins to produce mars under a load of 100 g or greater. More preferably, the surface has a pencil hardness of 3H or greater and the steel wool abrasion begins to produce mars under a load of 300 g or greater. In the shaped articles of the present invention, it is also preferable that, the surface thereof has 0.02 to 0.2 µmol/cm$^2$ (more preferably 0.03 to 0.15 µmol/cm$^2$) of acidic groups while retaining the above-described level of hardness.

In the present invention, the quantity of acidic groups is expressed as the number of micromoles of a basic dye which can be adsorbed onto a unit area of the surface of the shaped article (i.e., in µmol/cm$^2$). This value can be obtained according to the following procedure.

(1) A 0.1N sodium acetate buffer solution (pH 4.5) is prepared.

(2) Using this buffer solution, a 1.0 g/l Methyl Violet solution is prepared.

(3) A shaped article made in accordance with the present invention and measuring 50 mm×50 mm is immersed in the above solution (at 25° C.) for 72 hours.

(4) The shaped article is taken out of the solution and washed with water.

(5) After washing, the shaped article is wiped dry.

(6) The dye is extracted by soaking the shaped article in N-dimethylformamide for 24 hours.

(7) The absorbance of the dye extract is measured at a wavelength of 589 nm.

(8) Separately, a calibration curve is constructed by using a series of dye solutions in N-dimethylformamide. Using this calibration curve, the concentration of the basic dye per unit area of the shaped article is determined.

For a shaped article of the type illustrated in FIG. 5, the following measuring procedure is followed.

A shaped article (a) is made by subjecting the polymer layer to ultraviolet light irradiation and alkali treatment under the same conditions as for the shaped article of FIG. 5, except that the whole surface of the polymer layer was irradiated without using any mask pattern. Similarly, a shaped article (b) is made by omitting the ultraviolet light irradiation and subjecting the polymer layer to alkali treatment under the same conditions as for the shaped article of FIG. 5. For these two shaped articles, measurements are made according to the above-described steps (1) to (8).

When determined according to the above measuring procedure, the quantity of acidic groups is expressed as the number of micromoles of a basic dye which can be adsorbed onto a unit area of the surface of the shaped article (i.e., in µmol/cm$^2$). The quantity of acidic groups present per unit area of the surface of the shaped article (a) corresponds to the quantity of acidic groups present per unit area of the depressed parts, and the quantity of acidic groups present per unit area of the surface of the shaped article (b) corresponds to the quantity of acidic groups present per unit area of the raised parts.

In the shaped articles of the present invention, the quantity of acidic groups present in the depressed parts, as determined by the above-described procedure, is preferably not less than 0.02 µmol/cm$^2$ and the quantity of acidic groups present in the raised parts is preferably not greater than 0.018 µmol/cm$^2$.

In each of the above-described three types (i) to (iii), the shaped articles of the present invention can additionally have antistatic properties which are imparted thereto by covering the acidic group-bearing surface with a metallic compound and/or organic cationic compound containing a metallic element belonging to group III, IV or Y of the periodic table. The metallic compound and/or organic cationic compound exhibits strong adhesion to the acidic groups 3. This phenomenon is presumed to be attributable to generally known interactions between functional groups, such as chemical bonds, hydrogen bond, acid-base interaction and charge transfer interaction.

Now, the method of making shaped articles in accordance with the present invention will be described hereinbelow.

The monomer (or monomer mixture) used to form the surface portion, or the whole, of the shaped articles of the present invention comprises a compound having two or more (meth)acryloyloxy groups per molecule. Examples of such compounds include 1,4-butanediol diacrylate, 1,6-hexanediol diacrylate, neopentyl glycol diacrylate, ethylene glycol diacrylate, triethylene glycol diacrylate, tripropylene glycol diacrylate, dipropylene glycol diacrylate, 3-methylpentanediol diacrylate, diethylene glycol bis(β-acryloxypropionate), trimethylolethane diacrylate, trimethylolpropane triacrylate, pentaerythritol triacrylate, dipentaerythritol hexaacrylate, tri(2-hydroxyethyl) isocyanurate diacrylate, pentaerythritol tetraacrylate, 2,3-bis(acryloyloxyethyloxymethyl)bicyclo[2.2.1]heptane, poly-1,2-butadiene diacrylate, 1,2-bisacryloyloxymethylhexane, tetradecanethylene glycoldiacrylate, poly-1,2-butadiene dimethacrylate, ethylene glycol dimethacrylate, triethylene glycol dimethacrylate, 1,10-decanediol dimethacrylate, 3,8-bis(acryloyloxymethyl)tricyclo[5.2.10]decane, hydrogenated bisphenol A diglycidyl ether diacrylate, 2,2-bis(4-acryloyloxydiethoxyphenyl)propane, 1,4-bis(acryloyloxymethyl)cyclohexane, neopentyl glycol hydroxypivalate diacrylate, bisphenol A diglycidyl ether diacrylate, epoxidized bisphenol A diacrylate, and 2,2-bis(4-methacryloyloxydiethoxyphenyl)propane.

These multifunctional monomers may be used alone or in admixture of two or more. If necessary, they may be copolymerized with monofunctional monomers. If only a monofunctional monomer such as methyl methacrylate is used (i.e., no multifunction monomer is used) to form the surface portion of a shaped article, subsequent ultraviolet light irradiation and alkali treatment will fail to produce a sufficient quantity of acidic groups and to provide adequate hardness. Thus, it is an essential feature of the present invention to use a multifunctional monomer (i.e., a monomer having two or more (meth)acryloyloxy groups per molecule).

In order to produce acidic groups over the whole surface of a flat polymer layer as illustrated in FIG. 3, the whole surface of the polymer layer is irradiated with ultraviolet light having a wavelength of 300 nm or less. This ultraviolet light irradiation may be carried out by employing suitable conditions (such as wavelength range and irradiation time) chosen so as to provide sufficient energy to break a part of the ester linkages in the polymer or a part of the crosslinked structure of the polymer. It is impossible to specify such conditions generally, because the bond energy between molecules varies with the composition of the polymer.

However, it is desirable to use ultraviolet light within a wavelength range which can provide an energy of about 4 eV or greater. This ultraviolet light preferably has a wavelength within the range of 180 to 300 nm.

A sufficient quantity of acidic groups are not produced by the ultraviolet light irradiation alone. Accordingly, the ultraviolet light-irrdiated surface shows little enhancement in affinity for for basic dyes.

Subsequently, the ultraviolet light-irradiated surface is subjected to an ordinary alkali treatment. This alkali treatment, in cooperation with the effect of the preceding ultraviolet light irradiation, produces acidic groups. The aqueous alkaline solutions which can be used for this alkali treatment include, for example, aqueous solutions of sodium hydroxide, potassium hydroxide and the like, and such solutions additionally containing suitable solvents such as alcohols. The conditions of the alkali treatment cannot be specified generally, because they may vary according to the amount of ultraviolet light exposure, the composition of the ultraviolet light-irradiated surface, the geometry of the shaped article, the desired performance and the like. However, sodium hydroxide, for example, is preferably used in the form of an aqueous solution having a concentration of 0.1 to 50% by weight and more preferably 1 to 30% by weight. The alkali treatment time is generally within the range of 0° to 100° C. and preferably 20° to 80° C. The alkali treatment time is preferably within the range of 0.91 to 100 hours and more preferably 0.1 to 10 hours. After alkali treatment, the shaped article is suitably cleaned, for example, by washing with water.

Figure 6:
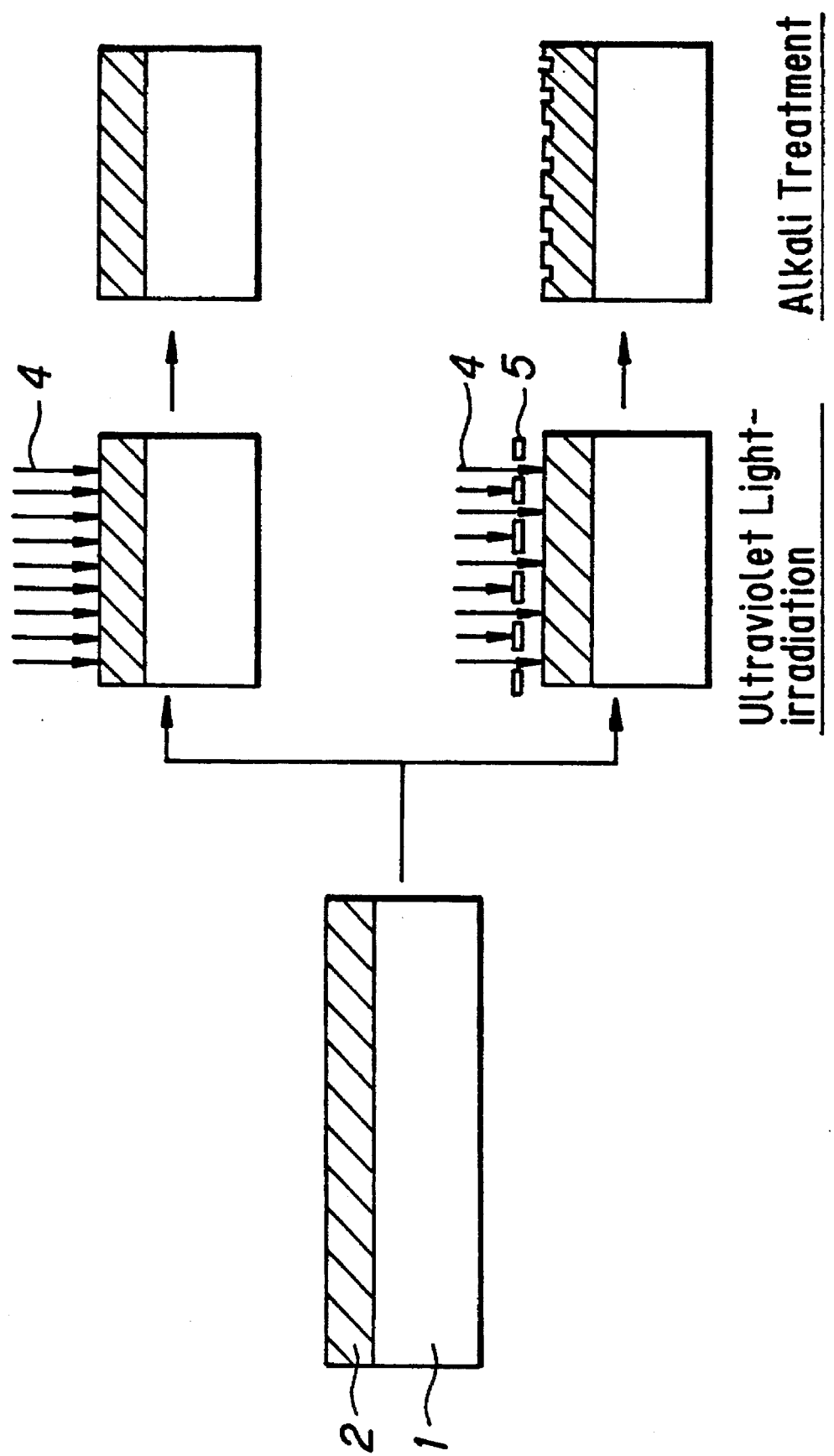
FIG. 6 is a flow diagram illustrating the method of the present invention.
Figure 7:
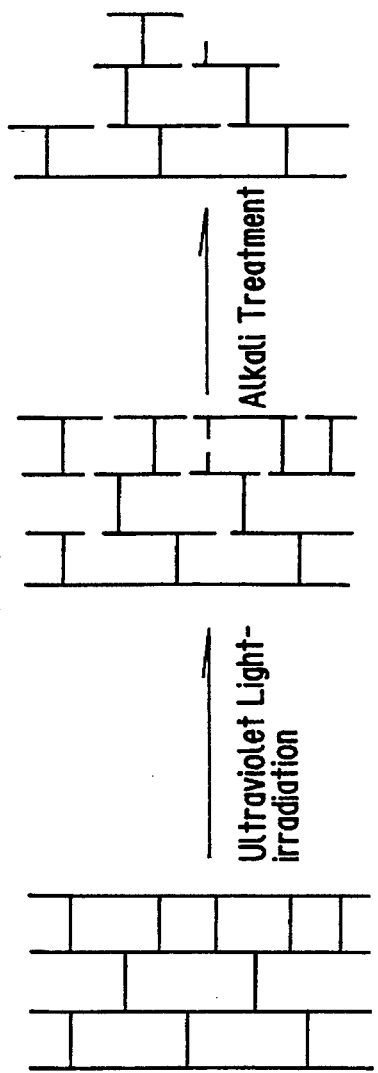
FIG. 7 is a diagram illustrating the reactions which are presumed to take place during the ultraviolet light irradiation and alkali treatment of the present invention.

FIG. 6 illustrates two instances of the ultraviolet light irradiation and alkali treatment steps, including the embodiment in which the whole surface is irradiated with ultraviolet light 4 and the embodiment in which the surface is irradiated with ultraviolet light 4 through a light controlling material 5. FIG. 7 illustrates a model of the reactions which are presumed to take place during these steps. Specifically, the irradiation with ultraviolet light having a wavelength of 300 nm or less breaks a part of the crosslinked structure of the polymer and thereby reduces its molecular weight. The resulting low-molecular-weight products are readily hydrolyzed and dissolved out by the subsequent alkali treatment.

In order to impart an undulated profile to the surface of the polymer layer and produce acidic groups therein, there are three processes differing in the manner in which the irradiation with ultraviolet light having a wavelength of 300 nm or less is carried out. These processes are as follows:

(1) The polymer layer 2 is irradiated, through a light controlling material, with ultraviolet light having a wavelength of 300 nm or less.

(2) The surface of the polymer layer 2 is scattered with a particulate material capable of absorbing ultraviolet light within the wavelength range of 300 nm or less, and then irradiated with ultraviolet light having a wavelength of 300 nm or less.

(3) A matte film or plate is placed in close proximity to the polymer layer 2 and irradiated with ultraviolet light having a wavelength of 300 nm or less.

The light controlling material used in process (1) can be any material having a desired pattern consisting of parts capable of transmitting ultraviolet light within the wavelength range of 300 nm or less, and parts incapable of transmitting it. By way of example, mask patterns having minute openings may preferably used as light controlling materials. Useful mask patterns include, for example, mesh-like materials such as silk screens for screen printing, gauze, fabrics, nonwoven fabrics, knitted fabrics, punching metals, wire cloth and other filters.

The shape and arrangement pattern of the ultraviolet light transmitting parts may be suitably chosen so that the minute undulations finally formed in the surface of the shaped article may perform an adequate antireflection function.

In process (2), the surface of the polymer layer 2 is scattered with a particulate material capable of absorbing ultraviolet light within the wavelength range of 300 nm or less so as to bring about a desired state of distribution, and then irradiated with ultraviolet light having a wavelength of 300 nm or less.

More specifically, since the scattered particulate material serves as a light controlling material, a minute pattern consisting of ultraviolet light-irradiated areas and non-irradiated areas is produced on the surface of the polymer layer 2. Thus, when the polymer layer 2 is subjected to an alkali treatment which will be described later, undulations are formed according to the ultraviolet light irradiation pattern. The term "scattering" as used herein means the process of disposing a particulate material on the surface of the polymer layer 2 so as to create a state of distribution which permits the particulate material to act as a light controlling material for forming desired undulations. No particular limitation is placed on the scattering method, so long as such a state of distribution is created. For this purpose, any of various conventionally known scattering methods can be used. For example, a dispersion medium containing a particulate material may be applied onto the surface to form a layer thereof, or a particulate material may simply be scattered over the surface.

The particulate material should have an average particle diameter ranging from 0.01 µm to 1 mm. If a particulate material having an average particle diameter less than 0.01 µm or greater than 1 mm is used, an undulated surface exhibiting desired properties such as adequate transparency will not be formed. Moreover, if a particulate material having an average particle diameter substantially less than the wavelength range (0.4 to 0.8 µm) of visible light, the polymer layer having an undulated surface will look pale and it may become difficult to discern transmitted images clearly. Where this fact needs to be taken into consideration, the average particle diameter should preferably be not less than 0.1 µm. Furthermore, if it is desirable that the outlines of transmitted images are easily visible, the average particle diameter should preferably be not greater than 50 µm. The average particle diameter can be determined with an optical microscope, electron microscope or the like.

The degree of absorption of ultraviolet light within the wavelength range of 300 nm or less by the particulate material may be such that there is a substantial difference in the amount of ultraviolet light exposure between the surface areas cover with the particulate material and the surface areas not covered therewith. That is, no complete (or 100%) absorption of the ultravilet light is required. Any of the particulate materials capable of absorbing ultraviolet light in this manner can be used in the practice of the present invention. Useful examples of such particulate materials include various types of particles, such as polystyrene beads having an average diameter of about 8 um and titanium oxide particles having an average diameter of about 0.5 µm. The use of such a particulate material to form undulations has the advantage that the undulations can be easily controlled by modifying the average particle diameter and dispersibility of the particulate material.

The matte film or plate used in process (3) is a material having a light transmittance of not less than 10%, preferably not less than 50%, for ultraviolet light within the wavelength range of 300 nm or less and, in particular, within the wavelength range of 240 to 260 nm. More specifically, minute depressed and raised parts must be randomly distributed in one or both surfaces of the material. These depressed and raised parts must be characterized in that the difference of altitude between the depressed and the raised parts is larger than the wavelength of the ultraviolet light used and the density of the depressed and raised parts ranges from $6\times10^2/cm^2$ to $6\times10^8/cm^2$.

The reasons why the depressed and raised parts must have a density within the above-defined range are as follows: The density of the depressed and raised parts is determined from the number of depressed or raised parts per square millimeter, i.e., the period of the depressed or raised parts. If the density is greater than $6\times10^8/cm^2$ (corresponding to a depressed part width of 0.2 μm and a raised part width of 0.2 μm), the incident ultraviolet light will undergo a significant degree of irregular relection, resulting a decrease of the light transmitted by the film or plate. On the other hand, if the density is less than $6\times10^2/cm^2$ (corresponding to a depressed part width of 200 μm and a raised part width of 200 μm), the constrast of the speckle pattern (described later) produced by the interference of transmitted light waves will be reduced. For these reasons, the above-described condition concerning the density of the depressed and raised parts has been employed. More preferably, the density of the depressed and raised parts ranges from $10^6/cm^2$ (corresponding to a depressed part width of 5 μm and a raised part width of 5 μm) to $6\times10^4/cm^2$ (corresponding to a depressed part width of 20 μm and a raised part width of 20 μm).

The condition concerning the difference of altitude between the depressed and the raised parts is required to cause the incident ultraviolet light to be scattered sufficiently. As described above, the depressed and raised parts of the film or plate may be formed either in one surface thereof or in both surfaces thereof.

If the light transmittance for ultraviolet light within the wavelength range of 300 nm or less is less than 10%, the ultraviolet energy will be absorbed and, therefore, the effects of the present invention will not be produced satisfactorily. This is the reason why the above-described condition concerning light transmittance is employed.

Furthermore, in this process (3), the film or plate is disposed in close proximity to the surface of the polymer layer. This means that the film or plate is spaced from the surface of the polymer layer within twice the interference distance at which an intereference pattern having the highest contrast is produced.

More specifically, when the central wavelength of the incident ultraviolet light is denoted by λ (nm), the central frequency of the incident ultraviolet light by f (Hz), the wavelength width of the incident ultraviolet light by Δλ (nm), and the velocity of light by c (cm/sec), the condition to be satisfied by the distance, d (nm), between the middle line of the depressed and raised parts and the surface of the polymer layer is given by $d \leq (2\times c\times\lambda)/(\Delta\lambda\times f)$.

The irradiation with ultraviolet light having a wavelength of 300 nm or less can be carried out by means of a high-pressure mercury vapor lamp or a low-pressure mercury vapor lamp, as will be described later.

The matte film preferably comprises a film of polypropylene, polyvinyl alcohol, cellophane or the like, and the matte plate preferably comprises a quartz plate. In the above-described ultraviolet light irradiation processes (1) and (2), a pattern consisting of light and dark areas is produced on the surface of the polymer layer by intercepting the ultraviolet light. In process (3), however, an interference figure called a "speckle pattern" is produced on the surface of the polymer layer as will be described later.

Figure 8:
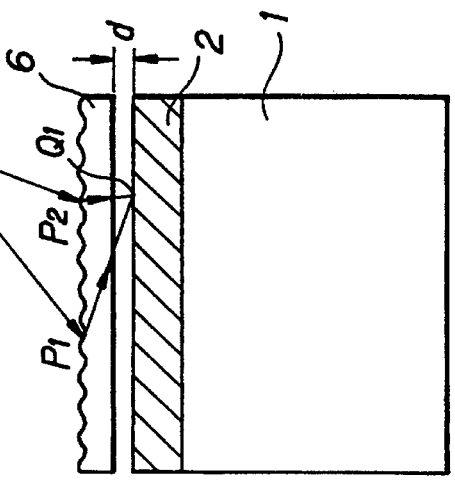
FIG. 8 is a schematic view illustrating an instance of the ultraviolet light irradiation step.
Figure 9:
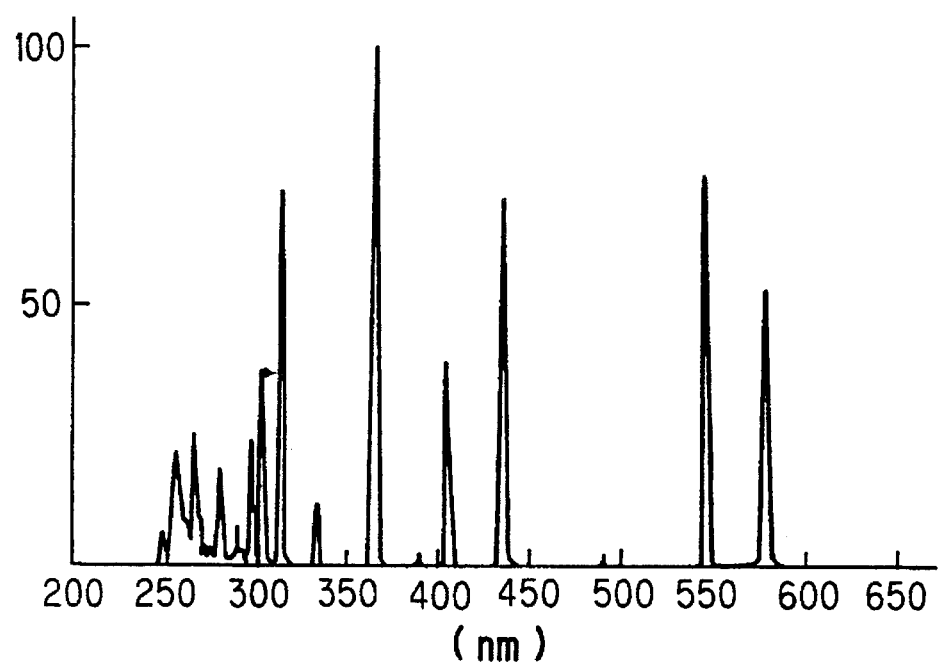
FIG. 9 is a graph illustrating the emission spectrum of a high-pressure mercury vapor lamp.
Figure 10:
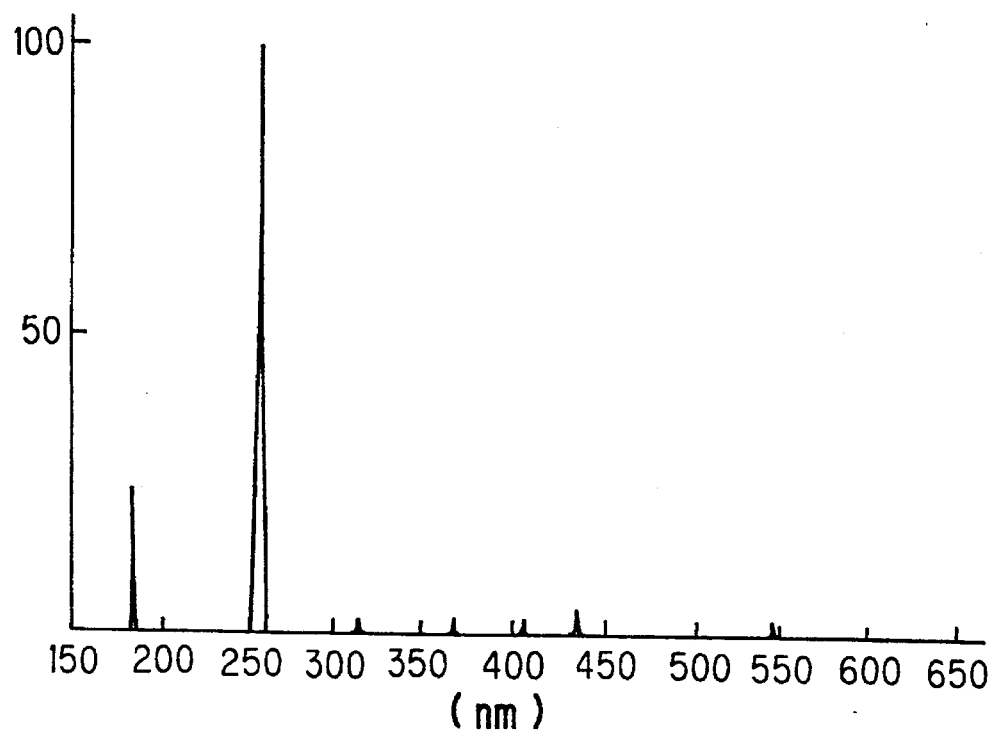
FIG. 10 is a graph illustrating the emission spectrum of a low-pressure mercury vapor lamp.

The ultraviolet light irradiation step in which a matte film or plate is placed on top of the polymer layer 2 shown in FIG. 1 and then irradiated with ultraviolet light having a wavelength of 300 nm or less is schematically illustrated in FIG. 8. The emission spectra of a high-pressure mercury vapor lamp and a low-pressure mercury vapor lamp are shown in FIGS. 9 and 10, respectively. It can be seen from these figures that both light sources emit ultraviolet light having wavelengths of 300 nm or less.

When light having a wavelength of 254 nm is incident on a film or plate as defined above, the light transmitted thereby is scattered in random directions. This is because the film or plate has minute depressed and raised parts in one or both surfaces thereof, a specific difference of altitude between the depressed and the raised parts, and a specific density of the depressed and raised parts. Moreover, the depressed and raised areas are distributed randomly, so that the phases of the scattered light waves have no correlation with one another.

In FIG. 8, when the scattered light waves from two points $P_1$ and $P_2$ on the undulated surface of the film or plate 6 meet at a point $Q_1$ on the surface of the polymer layer 2, they augment or diminish each other according to the phase relationship between them. Thus, a pattern consisting of randomly positioned light and dark spots is produced on the surface of the polymer layer 2.

As previously defined, this interference pattern is produced when the film or plate 6 is disposed in close proximity to the polymer layer 2. As a result of intensive investigation, the present inventors have found that, when the film or plate 6 is spaced from the polymer layer 2 within twice the interference distance $d$ $[=(c\times\lambda)/(\Delta\lambda\times f)]$ at which an interference pattern having the highest contrast is produced, an interference pattern (i.e, a speckle pattern) useful in the present invention can be obtained, though the contrast may become lower. The production of speckle patterns has been reported by J. D. Rigden and E. I. Gordon [Proc. IRE, 50, 2367 (1962)], B. M. Oliver [Proc. IEEE, 51,220 (1963)], and M. von Laue [Sizungsbar Akad. Wiss. (Berlin), 44, 1144 (1914)].

When calculations are made under the assumption that a low-pressure mercury vapor lamp having a central wavelength of 254 nm, a wavelength width of 5 nm and a central frequency of $1.2\times10^{15}$ Hz is used as the light source, the range of $2d$ is given by $2d \leq 26$ μm.

Figure 11:
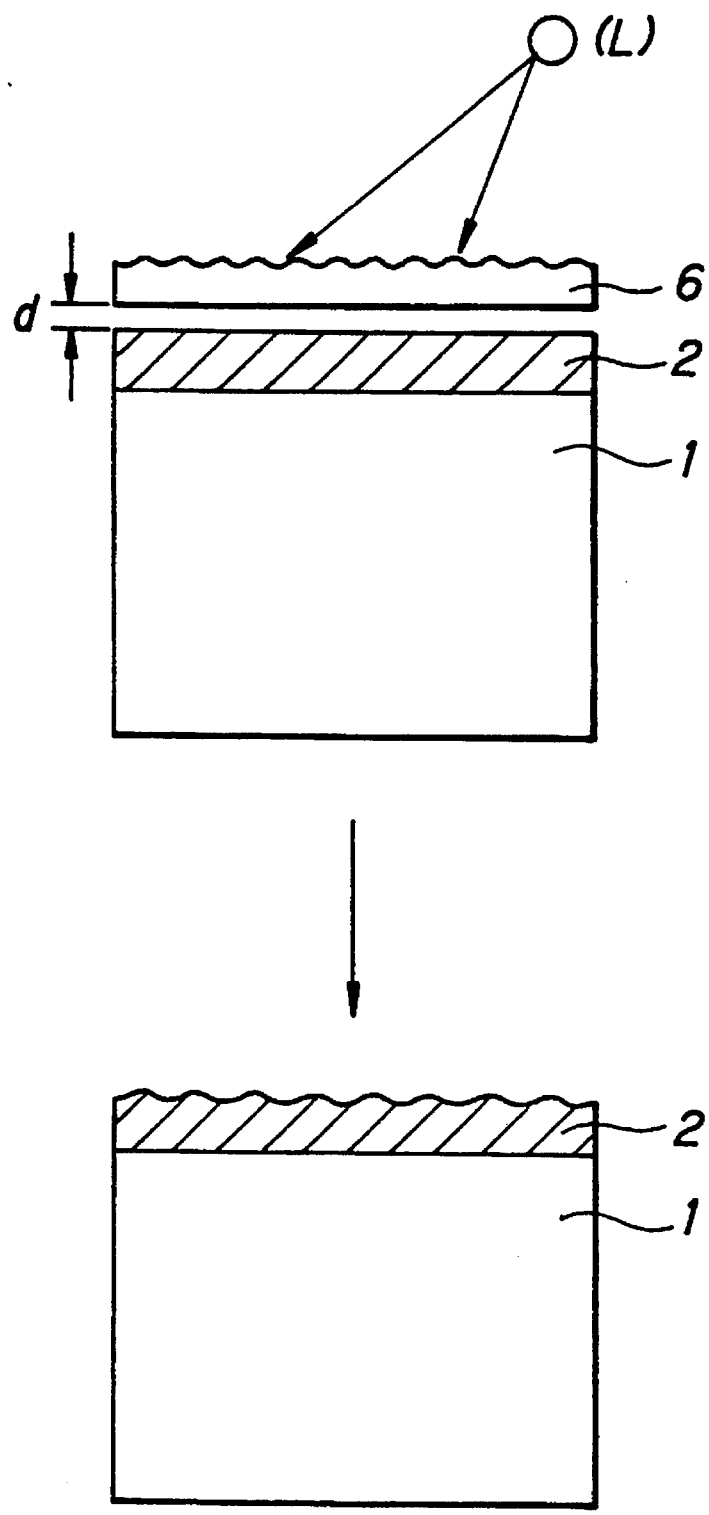
FIG. 11 is a flow diagram illustrating an instance of the ultraviolet light irradiation and alkali treatment steps.

In the above-described case, when the distance between the film or plate and the polymer layer is set at 0–26 μm, a pattern consisting of randomly positioned light and dark spots (i.e., a speckle pattern) is produced by the interference of scattered light waves having random phases. The ultraviolet light irradiation and alkali treatment steps in process (3) are illustrated in FIG. 11.

In all of processes (1), (2) and (3), no undulations are formed solely by irradiating the surface of the polymer layer with ultraviolet light in a pattern of light and dark areas. It is after an alkali treatment is carried out subsequently to the ultraviolet light irradiation that undulations are formed in the surface of the polymer layer. The mechanism by which these undulations are formed in the surface of the polymer layer is presumed to be such that, as illustrated in FIG. 7, a part of the bonds supporting the crosslinked structure of the polymer layer or a part of the ester linkages are broken only in the ultraviolet light-irradiated areas corresponding to the light spots, and the resulting low-molecular-weight products are hydrolyzed by the alkali treatment.

In addition to the above-described ultraviolet light irradiation processes (1)–(3), there is another process for forming a shaped article having acidic groups all over the undulated surface thereof. Specifically, a monomer solution containing at least a multifunctional monomer having two or more acryloyloxy groups per molecule is poured into a "mold" having an undulated surface characterized by its profile having an arithmetical mean deviation ($R_a$) of 0.1 to 5.0 µm and an average wavelength ($\lambda_a$) of 5 to 50 µm. After the monomer solution is cured, the resulting product is released from the mold to obtain a polymer layer having an undulated surface. The undulated surface of the polymer layer is irradiated with ultraviolet light having a wavelength of 300 nm or less and then subjected to an alkali treatment. Thus, there can be obtained a shaped article having acid radicals all over the undulated surface thereof.

If desired, the above-described shaped articles formed by irradiation with ultraviolet light having a wavelength of 300 nm or less and a subsequent alkali treatment may be treated with a metallic compound or organic cationic compound containing a metallic element belonging to group 3, 4 or 5 of the periodic table. This treatment will be specifically described hereinbelow.

Such metallic elements include, for example, silicon, aluminum, copper, zinc, titanium, vanadium, nickel, iron, silver, indium, tin, zirconium and antimony. Metallic compounds containing these elements include metal alkoxides, metal acetylacetonates, metallic soaps derived from naphthenic acid or octylic acid, inorganic chlorides of the elements, and the like. These metallic compounds may be used alone or in admixture, for example, by dissolving them in a suitable solvent.

The organic cationic compounds which can be used in the practice of the present invention include cationic surface active agents such as alkyltrimethylammonium salts, alkylpyridinium salts, alkylbenzyldimethylammonium salts, alkylmethyldipolyethoxyammonium salts, dialkyldimethylammonium salts and 1-(2-acylaminoethyl)-1-methyl-2-alkylimidazolinium salts. Moreover, high- or medium-molecular-weight compounds having cationic groups on their side chains or the like can also be used.

In addition, so-called amphoteric compounds exhibiting cationic properties during use can also be used as organic cationic compounds in the practice of the present invention. They include, for example, amphoteric surface active agents such as N-alkylamino acids, N-alkyldimethylamino acids and alkyldimethylamine oxides.

Treatment with such a metallic compound or organic cationic compound serves to supply the compound to the surface of the shaped article and thereby impart desired antistatic properties thereto. In the practice of the present invention, this treament can be carried out according to any of various conventional processes for antistatic treatment. For example, the above-described compound, as such or in solution in a suitable solvent, may be applied to the surface of the shaped article according to a technique such as spraying, dipping or coating. Subsequently, the surface of the shaped article may be washed or heat-treated as required. As a result of this treatment, there can be obtained shaped articles having an electrical surface resistance of $10^{11}$ Ω/□ or less. Owing to such a low electrical surface resistance, the shaped articles exhibit excellent antistatic properties. The electrical surface resistance is preferably in the range of $10^6$ to $10^{11}$ Ω/□, and can further be reduced to $10^5$ Ω/□ or less depending on the type of the metallic compound or the like. Unless otherwise stated, the "electrical surface resistance" as used herein means a value measured by the usual four-probe measuring method (JIS H 0602) in an atmosphere having a temperature of 20° C. and a relative humidity of 65%.

The present invention is further illustrated by the following examples.

Radiant energy of ultraviolet light and several characteristics were measured according to the following procedures.

(1) Radiant energy of ultraviolet light

The intensity of ultraviolet light at a wavelength of 254 nm was measured by means of a Model C3934-01 Ultraviolet Actinometer (manufactured-by Hamamatsu Photonits Co., Ltd.).

(2) Total light transmittance, T(%)

(3) Haze value, $H_d$

These characteristics were measured with measuring instruments conforming to ASTM D-1003 and JIS K 7105.

(4) 60-degree specular gloss, $R_{60}$

This characteristic was measured according to JIS Z 8741. An untreated smooth acrylic resin plate (Acrylite MR; manufactured by Mitsubishi Rayon Co., Ltd.) was used as the reference surface and the value obtained therefrom was taken as 100.

(5) Arithmetical mean deviation, $R_a$, and average wavelength, $\lambda_a$, of the profile These characteristics were measured with a contact needle type surface roughness measuring apparatus conforming to JIS B 0651.

Examples 1–4 and Comparative Examples 1–2

In Examples 1–4, each of various functional monomer solutions having the respective compositions shown in Table 1 was applied to a substrate and then cured to form a polymer layer. Using a low-pressure mercury vapor lamp, the surface of the polymer layer Was irradiated with ultraviolet light having a wavelength of 254 nm. Then, the substrate having the polymer layer was soaked in an aqueous solution of sodium hydroxide. As a result, a surface hardness of 4H or 5H was achieved and, at the same time, a sufficient quantity of acidic groups were produced over the whole surface of the polymer layer. In contrast, when a polymer layer formed on a substrate was subjected to ultraviolet light irradiation alone (Comparative Example 1) or a polymethyl methacrylate resin plate having no polymer layer was treated (Comparative Example 2), a sufficient quantity of acidic groups were not produced.

The operating conditions and the results of measurement are shown in Table 1.

Examples 5–12 and Comparative Examples 3–4

Figure 13:
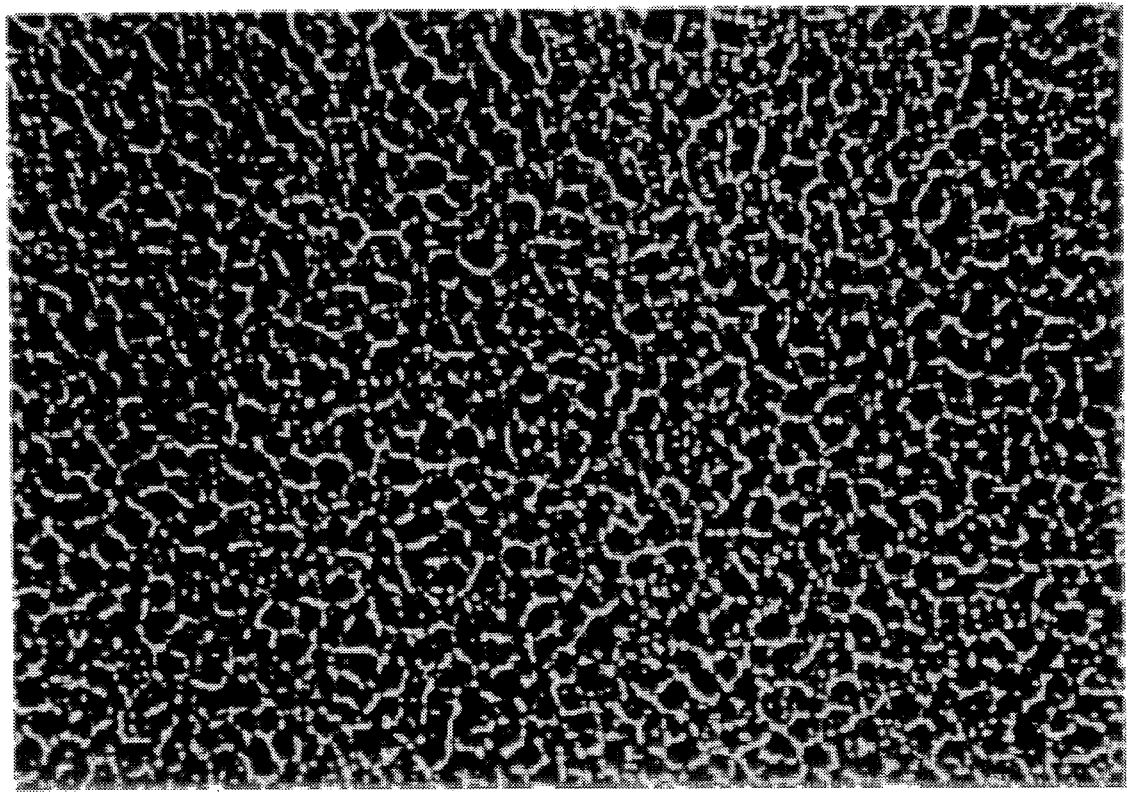
FIG. 13 is a photomicrograph (×100) of a polymer surface formed in one example of the present invention.

In these examples and comparative examples, a polymer layer was formed on a substrate by using each of the multifunctional monomer solutions shown in Table 2. Then, undulations were formed in the surface of the polymer layer by applying thereto ultraviolet light having a wavelength of 300 nm or less through a light controlling material and subsequently soaking the substrate having the polymer layer in an aqueous solution of sodium hydroxide. A larger quantity of acidic groups were present in the depressed parts than in the raised parts, and steel wool abrasion under a load of 500 g caused no change in optical properties. A photomicrograph of the polymer surface formed in Example 10 is shown in FIG. 13.

Figure 12:
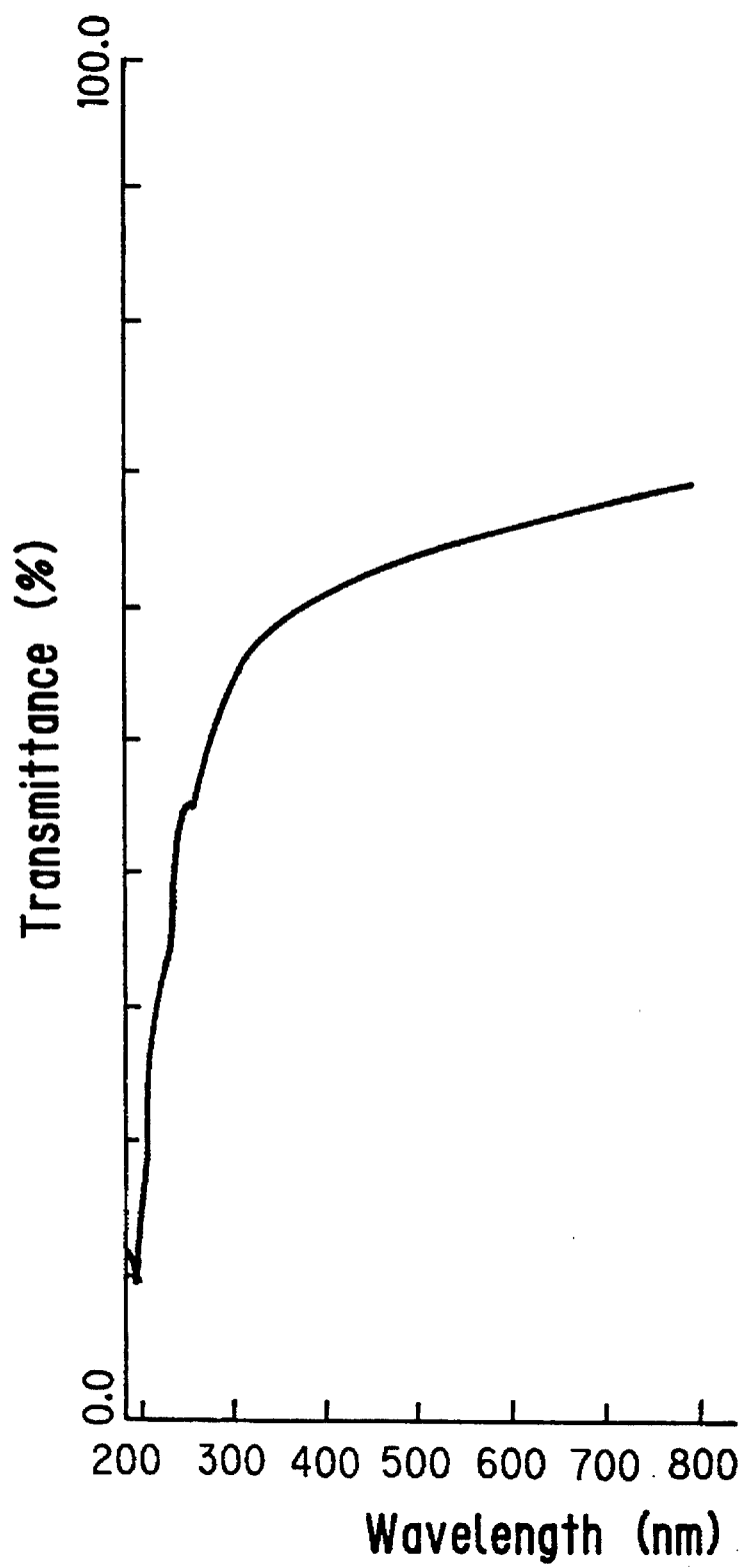
FIG. 12 is a graph illustrating the spectral transmittance curve of a matte film used in one example of the present invention.

The spectral transmittance curve of the matte film used in Example 10 is shown in FIG. 12. It can be seen from this figure that the transmittance at 254 nm is about 35%. In contrast, the matte films used in Comparative Examples 3 and 4 had a transmittance of about 0% at 254 nm. Accordingly, the polymer layer was not irradiated with a sufficient amount of ultraviolet light, so that no undulations were formed in the surface thereof.

The operating conditions and the results of measurement are shown in Table 2.

Examples 13–17 and Comparative Examples 5–6

In Examples 13–15, a polymer layer was formed on a substrate by using each of the multifunctional monomer solutions shown in Table 3. The whole surface of the polymer layer was irradiated with ultraviolet light having a wavelength of 300 nm or less, and the substrate having the polymer layer was soaked in an aqueous solution of sodium hydroxide. Then, an antistatic agent solution having the composition shown in Table 5 was applied to the surface of the polymer layer and dried at 70° C. for 30 minutes. In Examples 16–17, an antistatic agent solution having the composition shown in Table 5 was applied to the surface of the shaped articles obtained in Examples 10 and 12, and dried at 80° C. for 30 minutes.

The operating conditions and the results of measurement are shown in Tables 3, 4 and 5.

(Evaluation of antistatic properties)

A thin film of silicon oxide containing tin oxide was formed in Examples 13, 15 and 16, and a thin film of tin oxide containing antimony was formed in Examples 14 and 17. Consequently, the resulting shaped articles exhibited antistatic properties characterized by a resistivity of $10^7$ to $10^9$ $\Omega/\square$. They retained the same antistatic properties even after being subjected to a steel wool abrasion test for mar resistance.

In Comparative Examples 5 and 6, an antistatic agent solution was applied to an untreated (or as-formed) polymer layer and then dried. The thin film so formed had poor adhesion to the polymer layer, so that the resistivity increased to $10^{13}$ $\Omega/\square$ or higher after the polymer layer was subjected to a steel wool abrasion test for mar resistance. Thus, the resulting shaped articles failed to exhibit adequate antistatic properties.

The results thus obtained are shown in Tables 3 and 4.

TABLE 1

| | Multifunctional monomer solution | | Radiant energy of ultraviolet light at 254 nm (mJ/cm$^2$) | NaOH treatment | | | Quantity of acidic groups ($\mu$mol/cm$^2$) | Surface hardness (pencil hardness) | Substrate |
|---|---|---|---|---|---|---|---|---|---|
| | Monomers and solvent | wt. % | | Temperature (°C.) | Concentration (%) | Soaking time (min.) | | | |
| Example 1 | Dipentaerythritol hexaacrylate | 10 | 1300 | 20 | 20 | 180 | 0.05 | 5H | Polymethyl methacrylate resin plate |
| | Equimolar condensate of succinic acid/trimethylolethane/acrylic acid | 20 | | | | | | | |
| | Tetrahydrofurfuryl acrylate | 5 | | | | | | | |
| | Photopolymerization initiator | 1 | | | | | | | |
| | Isopropanol | 34 | | | | | | | |
| | Toluene | 30 | | | | | | | |
| Example 2 | Trimethylolethane diacrylate | 8.5 | 6000 | 50 | 10 | 30 | 0.09 | 4H | Polycarbonate plate |
| | 1,6-Hexanediol diacrylate | 60 | | | | | | | |
| | Equimolar condensate of succinic acid/trimethylolethane/acrylic acid | 30 | | | | | | | |
| | Photopolymerization initiator | 1.5 | | | | | | | |
| Example 3 | Dipentaerythritol hexaacrylate | 16 | 1000 | 20 | 10 | 120 | 0.078 | 5H | Polymerthyl methacrylate resin plate |
| | Trimethylolethane diacrylate | 10 | | | | | | | |
| | Tetrahydrofurfuryl acrylate | 9 | | | | | | | |
| | Photopolymerization initiator | 2 | | | | | | | |
| | Isopropanol | 30 | | | | | | | |
| | Toluene | 32 | | | | | | | |
| Example 4 | Trimethylolethane diacrylate | 20 | 6000 | 50 | 10 | 10 | 0.07 | 4H | Polymethyl methacrylate resin plate |
| | 1,6-Hexanediol diacrylate | 30 | | | | | | | |
| | Photopolymerization initiator | 2 | | | | | | | |
| | Isopropanol | 24 | | | | | | | |
| | Toluene | 24 | | | | | | | |
| Comparative Example 1 | Trimethylolethane diacrylate | 8.5 | 1300 | — | — | — | 0.005 | 4H | Polycarbonate plate |
| | 1,6-Hexanediol diacrylate | 60 | | | | | | | |
| | Equimolar condensate of succinic acid/trimethylolethane/acrylic acid | 30 | | | | | | | |

TABLE 1-continued

| | Multifunctional monomer solution | | Radiant energy of ultraviolet light at 254 nm (mJ/cm$^2$) | NaOH treatment | | | Quantity of acidic groups (μmol/cm$^2$) | Surface hardness (pencil hardness) | Substrate |
|---|---|---|---|---|---|---|---|---|---|
| | Monomers and solvent | wt. % | | Temperature (°C.) | Concentration (%) | Soaking time (min.) | | | |
| Comparative Example 2 | Photopolymerization initiator Not used | 1.5 | 1300 | 20 | 20 | 180 | 0.007 | H | Polymethyl methacrylate resin plate |

TABLE 2

| | Multifunctional monomer solution | | Radiant energy of ultraviolet light at 254 nm (mJ/cm$^2$) | NaOH treatment | | | Quantity of acidic groups (μmol/cm$^2$) | Optical properties | |
|---|---|---|---|---|---|---|---|---|---|
| | Monomers and solvent | wt. % | | Temperature (°C.) | Concentration (%) | Soaking time (min.) | | T (%) | $R_{60}$ |
| Example 5 | Dipentaerythritol hexaacrylate | 16 | 3200 | 50 | 20 | 20 | 0.08 (depressed parts) 0.015 (raised parts) | 90 | 64 |
| | Trimethylolethane diacrylate | 11 | | | | | | | |
| | Tetrahydrofurfuryl acrylate | 9 | | | | | | | |
| | Photopolymerization initiator | 2 | | | | | | | |
| | Isopropanol | 30 | | | | | | | |
| | Toluene | 32 | | | | | | | |
| Example 6 | Trimethylolethane diacrylate | 20 | 3800 | 50 | 20 | 120 | 0.012 (depressed parts) 0.005 (raised parts) | 90 | 86 |
| | 1,6-Hexanediol diacrylate | 30 | | | | | | | |
| | Photopolymerization initiator | 2 | | | | | | | |
| | Isopropanol | 24 | | | | | | | |
| | Toluene | 24 | | | | | | | |
| Example 7 | Equimolar condensate of succinic acid/trimethylolethane/acrylic acid | 40 | 7800 | 70 | 10 | 12 | 0.05 (depressed parts) 0.012 (raised parts) | 90 | 23 |
| | 1,6-Hexanediol diacrylate | 58 | | | | | | | |
| | Photopolymerization initiator | 2 | | | | | | | |
| Example 8 | Equimolar condensate of succinic acid/trimethylolethane/acrylic acid | 40 | 8000 | 70 | 10 | 15 | 0.05 (depressed parts) 0.002 (raised parts) | 90 | 31 |
| | 1,6-Hexanediol diacrylate | 58 | | | | | | | |
| | Photopolymerization initiator | 2 | | | | | | | |
| Example 9 | Equimolar condensate of succinic acid/trimethylolethane/acrylic acid | 40 | 8000 | 70 | 10 | 15 | 0.05 (depressed parts) 0.005 (raised parts) | 90 | 38 |
| | 1,6-Hexanediol diacrylate | 58 | | | | | | | |
| | Photopolymerization initiator | 2 | | | | | | | |
| Example 10 | Equimolar condensate of succinic acid/trimethylolethane/acrylic acid | 40 | 3000 | 80 | 20 | 30 | 0.09 (depressed parts) 0.015 (raised parts) | 90 | 75 |
| | 1,6-Hexanediol diacrylate | 58 | | | | | | | |
| | Photopolymerization initiator | 2 | | | | | | | |
| Example 11 | Pentaerythritol diacrylate Trimethylolethane triacrylate | 50 | 3600 | 50 | 10 | 120 | 0.10 (depressed parts) 0.015 (raised parts) | 90 | 59 |
| | 1,6-Hexanediol diacrylate | 18 | | | | | | | |
| | Photopolymerization initiator | 2 | | | | | | | |

TABLE 2-continued

| | | | | | | | | | |
|---|---|---|---|---|---|---|---|---|---|
| Example 12 | Equimolar condensate of succinic acid/trimethylolethane/acrylic acid | 40 | 3000 | 80 | 20 | 90 | 0.007 (depressed parts) 0.005 (raised parts) | 90 | 42 |
| | 1,6-Hexanediol diacrylate | 58 | | | | | | | |
| | Photopolymerization initiator | 2 | | | | | | | |
| Comparative Example 3 | Equimolar condensate of succinic acid/trimethylolethane/acrylic acid | 40 | 3000 | 80 | 20 | 90 | 0.005 (all over the planar surface) | 90 | 100 |
| | 1,6-Hexanediol diacrylate | 58 | | | | | | | |
| | Photopolymerization initiator | 2 | | | | | | | |
| Comparative Example 4 | Equimolar condensate of succinic acid/trimethylolethane/acrylic acid | 40 | 3000 | 80 | 20 | 90 | 0.005 (all over the planar surface) | 90 | 100 |
| | 1,6-Hexanediol diacrylate | 58 | | | | | | | |
| | Photopolymerization initiator | 2 | | | | | | | |

| | Surface roughness | | | After abrasion test | | | |
|---|---|---|---|---|---|---|---|
| | $R_a$ (μm) | $\lambda_a$ (μm) | T (%) | $R_{60}$ | Substrate | Light controlling material |
| Example 5 | 0.43 | 50 | 90 | 64 | Polymethyl methacrylate resin plate | #400 mesh (polyester fiber) |
| Example 6 | 0.85 | 50 | 90 | 86 | Polymethyl methacrylate resin plate | #400 mesh (polyester fiber) |
| Example 7 | 0.5 | 10 | 90 | 23 | Polymethyl methacrylate resin plate | Polystyrene beads (with an average diameter of 1 um) |
| Example 8 | 0.5 | 10 | 90 | 31 | Polymethyl methacrylate resin plate | Titanium oxide particles (with an average diameter of 0.2 um) |
| Example 9 | 0.4 | 20 | 90 | 38 | Polymethyl methacrylate resin plate | Titanium oxide particles (with an average diameter of 5 um) |
| Example 10 | 0.4 | 35 | 90 | 75 | Polymethyl methacrylate resin plate | Matte film (a polypropylene film mfd. by Honshu Paper Manufacturing Co., Ltd.) |
| Example 11 | 0.5 | 20 | 90 | 59 | Polymethyl methacrylate resin plate | Matte film (a polypropylene film mfd. by Honshu Paper Manufacturing Co., Ltd.) |
| Example 12 | 1.4 | 20 | 90 | 42 | Polymethyl methacrylate resin plate | Matte film (a polypropylene film mfd. by Toray, Ltd.) |
| Comparative Example 3 | — | — | 90 | 100 | Polymethyl methacrylate resin plate | Matte film (a polyester film mfd. by Dia Foil Co. Ltd.) |

TABLE 2-continued

| | | | | | | |
|---|---|---|---|---|---|---|
| Comparative Example 4 | — | — | 90 | 100 | Polymethyl methacrylate resin plate | Matte film (a polycarbonate film mfd. by Mitsubishi Gas Chemistry Co., Ltd.) |

TABLE 3

| | Multifunctional monomer solution | | Radiant energy of ultraviolet light (mJ/cm$^2$) | NaOH treatment | | | Quantity of acidic groups (μmol/cm$^2$) | Optical properties | |
|---|---|---|---|---|---|---|---|---|---|
| | Monomers and solvent | wt. % | | Temperature (°C.) | Concentration (%) | Soaking time (min.) | | T (%) | H$_d$ (%) |
| Example 13 | Equimolar condensate of succinic acid/trimethylolethane/acrylic acid | 40 | 630 | 75 | 10 | 30 | 0.08 | 90 | 0.6 |
| | 1,6-Hexanediol diacrylate | 58 | | | | | | | |
| | Photopolymerization initiator | 2 | | | | | | | |
| Example 14 | Equimolar condensate of succinic acid/trimethylolethane/acrylic acid | 40 | 630 | 75 | 10 | 30 | 0.08 | 90 | 0.2 |
| | 1,6-Hexanediol diacrylate | 58 | | | | | | | |
| | Photopolymerization initiator | 2 | | | | | | | |
| Example 15 | Dipentaerythritol hexaacrylate | 16 | 320 | 75 | 10 | 15 | 0.10 | 90 | 0.6 |
| | Equimolar condensate of succinic acid/trimethylolethane/acrylic acid | 11 | | | | | | | |
| | Tetrahydrofurfuryl acrylate | 9 | | | | | | | |
| | Photopolymerization initiator | 4 | | | | | | | |
| | Xylene | 60 | | | | | | | |
| Comparative Example 5 | Equimolar condensate of succinic acid/trimethylolethane/acrylic acid | 40 | 0 | — | — | — | 0.005 | 90 | 0.2 |
| | 1,6-Hexanediol diacrylate | 58 | | | | | | | |
| | Photopolymerization initiator | 2 | | | | | | | |
| Comparative Example 6 | Equimolar condensate of succinic acid/trimethylolethane/acrylic acid | 40 | 0 | — | — | — | 0.005 | 90 | 0.2 |
| | 1,6-Hexanediol diacrylate | 58 | | | | | | | |
| | Photopolymerization initiator | 2 | | | | | | | |

| | Surface resistance at 20° C. and 60% RH (Ω/□) | After abrasion test | | | |
|---|---|---|---|---|---|
| | | T (%) | H$_d$ (%) | Surface resistance (Ω/□) | Substrate |
| Example 13 | 2 × 10$^9$ | 90 | 0.6 | 2 × 10$^9$ | Polymethyl methacrylate resin plate |
| Example 14 | 4 × 10$^7$ | 90 | 0.2 | 4 × 10$^7$ | Polymethyl methacrylate resin plate |
| Example 15 | 2 × 10$^9$ | 90 | 0.6 | 2 × 10$^9$ | Polymethyl methacrylate resin plate |

TABLE 3-continued

| | | | | | |
|---|---|---|---|---|---|
| | Comparative Example 5 | $4 \times 10^7$ | 80 | 32 | $>10^{13}$ Polymethyl methacrylate resin plate |
| | Comparative Example 6 | $2 \times 10^9$ | 80 | 32 | $>10^{13}$ Polymethyl methacrylate resin plate |

TABLE 4

| | Shaped article treated with antistatic agent | Optical properties | | | Surface resistance at 20° C. and 60% RH ($\Omega/\square$) | After abrasion test | | | |
|---|---|---|---|---|---|---|---|---|---|
| | | T (%) | $H_d$ (%) | $R_{60}$ | | T (%) | $H_d$ (%) | $R_{60}$ | Surface resistance ($\Omega/\square$) |
| Example 16 | Shaped article obtained in Example 10 | 90 | 3.5 | 75 | $2 \times 10^9$ | 90 | 3.5 | 75 | $2 \times 10^9$ |
| Example 17 | Shaped article obtained in Example 12 | 90 | 3.3 | 42 | $4 \times 10^7$ | 90 | 3.3 | 42 | $4 \times 10^7$ |

TABLE 5

| | Composition of antistatic agent solution | | | |
|---|---|---|---|---|
| | Compound | Weight (g) | Aging method | Application method |
| Examples 13, 15 and 16 Comparative Example 6 | Tetraethoxysilane Distilled water Ethanol Hydrochloric acid Stannic chloride | 100 150 100 1 4 | Allowed to stand at 60° C. for 4 days | Soak in the solution → take out → dry at 70° C. |
| Examples 14 and 17 Comparative Example 5 | Di-n-butyoxytin Distilled water Tri-n-butoxyantimony Butanol | 100 100 20 1000 | Allowed to stand at 25° C. for 3 days | Soak in the solution → take out → dry at 80° C. |

What is claimed is:

1. A shaped article having a polymer layer consisting essentially of a polymer derived from at least one multi-functional monomer having two or more (meth)acryloyloxy groups per molecule, the surface of the polymer layer presenting an undulated profile characterized by an arithmetical mean deviation ($R_a$) of from 0.1 to 5.0 μm and an average wavelength ($\lambda_a$) of from 5 to 50 μm, the surface of depressed parts of said polymer layer having 0.02 to 0.20 μmol/cm² of acidic groups produced by (a) irradiating a partial surface of said polymer layer with ultraviolet light having a wavelength of 300 nm or less through a light controlling material and (b) treating the irradiated surface with an alkali.

2. The shaped article of claim 1, said surface being covered with a metallic compound, an organic cationic compound containing a metallic element belonging to Group III, IV or V of the Periodic Table, or both.

3. The shaped article of claim 1, wherein said polymer has a pencil hardness of 3H or greater, evaluated by JIS K 5400.

4. A shaped article having a polymer layer consisting essentially of (i) a polymer derived from at least one multifunctional monomer having two or more (meth)acryloyloxy groups per molecule and (ii) a surface presenting an undulated profile characterized by an arithmetical mean deviation ($R_a$) of from 0.1 to 5.0 μm and an average wavelength ($\lambda_a$) of from 5 to 50 μm, said surface of said polymer layer having 0.02 to 0.20 μmol/cm² of acidic groups produced by (a) irradiating the whole surface of said polymer layer with ultraviolet light having a wavelength of 300 nm or less and (b) treating the irradiated surface with an alkali.

5. The shaped article of claim 4, wherein said polymer has a pencil hardness of 3H or greater, evaluated by JIS K 5400.

6. The shaped article of claim 4, said surface being covered with a compound selected from the group consisting of a metallic compound, an organic cationic compound containing a metallic element belonging to Group III, IV or V of the Periodic Table, and mixtures of said metallic compound and organic cationic compound.

7. An antistatic material comprising a shaped article having a polymer layer consisting essentially of a polymer derived from at least one multifunctional monomer having two or more (meth)acryloyloxy groups per molecule, the surface of the polymer layer having 0.02 to 0.20 μmol/cm² of acidic groups produced by (a) irradiating a whole or partial surface of said polymer layer with ultraviolet light having a wavelength of 300 nm or less and (b) treating the irradiated surface with an alkali, the surface being covered with a metallic compound, an organic cationic compound containing a metallic element belonging to Group III, IV or V of the Periodic Table, or both.

8. A shaped article having a polymer layer consisting essentially of a polymer derived from at least one multifunctional monomer having two or more (meth)acryloyloxy groups per molecule, a surface of said polymer layer having 0.02 to 0.20 µmol/cm² of acidic groups produced by (a) irradiating the whole surface of said polymer layer with ultraviolet light having a wavelength of 300 nm or less and (b) treating the irradiated surface with an alkali, said surface being covered with a metallic compound, an organic cationic compound containing a metallic element belonging to Group III, IV or V of the Periodic Table, or both.

9. An anti-reflection material having anti-static properties, comprising a shaped article having a polymer layer consisting essentially of a polymer derived from at least one multifunctional monomer having two or more (meth)acryloyloxy groups per molecule, said surface presenting an undulated profile characterized by an arithmetical mean deviation ($R_a$) of from 0.1 to 5.0 µm and an average wavelength ($\lambda_a$) of from 5 to 50 µm, the surface of said polymer layer having from 0.02 to 0.20 µmol/cm² of acidic groups produced by (a) irradiating a whole or partial surface of said polymer layer with ultraviolet light having a wavelength of 300 nm or less and (b) treating the irradiated surface with an alkali, and said surface being covered with a metallic compound, an organic cationic compound containing a metallic element belonging to Group III, IV or V of the Periodic Table, or both.

10. A method of making a shaped article, comprising the steps of
 (a) providing a polymer layer consisting essentially of a polymer derived from at least one multifunctional monomer having two or more (meth)acryloyloxy groups per molecule,
 (b) irradiating a whole or partial surface of said polymer layer with ultraviolet light having a wavelength of 300 nm or less, and
 (c) subjecting the irradiated surface to an alkali treatment.

11. The method of claim 10, further comprising the step of treating an undulated surface with a metallic compound, and organic cationic compound containing a metallic element belonging to Group III, IV or V of the Periodic Table, or both.

12. A method of making shaped articles comprising the steps of:
 (a) providing a polymer layer consisting essentially of a polymer derived from at least one multifunctional monomer having two or more (meth)acryloyloxy groups per molecule,
 (b) irradiating a partial surface of said polymer layer with ultraviolet light having a wavelength of 300 nm or less through a light controlling material, and
 (c) subjecting the irradiated surface to an alkali treatment to form a surface of the polymer layer presenting an undulated profile characterized by an arithmetical mean deviation ($R_a$) of from 0.1 to 5.0 µm and an average wavelength $\lambda_a$ of from 5 to 50 µm.

13. The method of making shaped articles of claim 12, wherein the light controlling material is a particulate material which has an average particle diameter ranging from 0.01 µm to 1 mm and which is capable of absorbing ultraviolet light within the wavelength range of 300 nm or less, and the surface is irradiated with ultraviolet light after the particulate material has ben scattered over the surface.

14. The method of making shaped articles of claim 12, which further comprises the step of treating the undulated surface with a metallic compound, an organic cationic compound containing a metallic element belonging to Group III, IV or V of the Periodic Table, or both.

15. The method of making shaped articles of claim 12, wherein the light controlling material is a matte film or plate.

16. A method of making shaped articles comprising the steps of:
 (a) providing a polymer layer consisting essentially of a polymer derived from at least one multifunctional monomer having two or more (meth)acryloyloxy groups per molecule, a surface of the polymer layer presenting an undulated profile characterized by an arithmetical mean deviation ($R_a$) of from 0.1 to 5.0 µm and an average wavelength $\lambda_a$ of from 5 to 50 µm,
 (b) irradiating the whole undulated surface with ultraviolet light having a wavelength of 300 nm or less, and
 (c) subjecting the irradiated surface to an alkali treatment.

17. The method of making shaped articles of claim 16, which further comprises the step of treating the undulated surface with a metallic compound, an organic cationic compound containing a metallic element belonging to Group III, IV or V of the Periodic Table, or both.

* * * * *